US008370722B2

(12) United States Patent
Sims et al.

(10) Patent No.: US 8,370,722 B2
(45) Date of Patent: Feb. 5, 2013

(54) APPARATUS AND METHOD FOR AUTOMATIC CONFIGURATION OF LIGHTING CONTROLLERS

(75) Inventors: William F. Sims, Murfreesboro, TN (US); Jason Lien, Murfreesboro, TN (US); Robert Moore, Goodlettsville, TN (US); Edwin Moore, Murfreesboro, TN (US)

(73) Assignee: Schneider Electric USA, Inc., Palatine, IL (US)

( * ) Notice: Subject to any disclaimer, the term of this patent is extended or adjusted under 35 U.S.C. 154(b) by 549 days.

(21) Appl. No.: 12/631,369

(22) Filed: Dec. 4, 2009

(65) Prior Publication Data

US 2011/0138263 A1 Jun. 9, 2011

(51) Int. Cl.
*H03M 13/00* (2006.01)
(52) U.S. Cl. .............................. 714/775; 714/781; 700/3
(58) Field of Classification Search .................. 714/775, 714/781, 799, 807, 819; 700/3, 7, 11, 17, 700/20, 21, 26, 90; 315/312, 313, 315
See application file for complete search history.

(56) References Cited

U.S. PATENT DOCUMENTS

| 4,947,484 | A | * | 8/1990 | Twitty et al. ................... 714/776 |
| 5,649,089 | A | * | 7/1997 | Kilner ............................. 714/6.3 |
| 6,295,541 | B1 | | 9/2001 | Bodnar et al. |
| 7,369,060 | B2 | | 5/2008 | Veskovic et al. |
| 7,411,489 | B1 | | 8/2008 | Elwell et al. |
| 2006/0125426 | A1 | | 6/2006 | Veskovic et al. |
| 2007/0273307 | A1 | | 11/2007 | Westrick et al. |
| 2008/0092075 | A1 | | 4/2008 | Jacob et al. |
| 2008/0180270 | A1 | | 7/2008 | Veskovic et al. |
| 2008/0185977 | A1 | | 8/2008 | Veskovic et al. |
| 2009/0177800 | A1 | * | 7/2009 | Gidron et al. ................. 709/248 |
| 2009/0184840 | A1 | | 7/2009 | Veskovic et al. |

* cited by examiner

*Primary Examiner* — Scott Baderman
*Assistant Examiner* — Joseph Kudirka
(74) *Attorney, Agent, or Firm* — Lando & Anastasi, LLP

(57) ABSTRACT

A lighting system controller is provided that is configured to automatically synchronize a lighting controller with a centralized configuration. In a particular example, this automatic synchronization activity may include modifying the configuration of the lighting controller to match configuration information stored locally on the lighting system controller. Conversely, this automatic synchronization activity may include modifying the locally stored configuration information to match the current configuration of the lighting controller. In some examples, the lighting system controller is configured to use cyclic redundancy checks when determining whether to modify configuration information.

20 Claims, 16 Drawing Sheets

APPARATUS AND METHOD FOR AUTOMATIC CONFIGURATION OF LIGHTING CONTROLLERS

BACKGROUND

1. Field of the Invention

At least one aspect in accord with the present invention relates generally to apparatus and processes for controlling illumination of lights, and more specifically, to apparatus and processes for automatically discovering and configuring lighting controllers.

2. Discussion of Related Art

Lighting is the largest single consumer of electric power in a typical building, often exceeding 30% of the total energy cost. To better manage the energy costs associated with lighting, lighting control systems are typically used. Lighting control systems are designed to manage energy consumption while providing light, where and when it is needed. Conventional lighting control systems include lighting controllers that are capable of activating and deactivating remotely operated circuit breakers or switches according to a predefined schedule. For example, lighting control systems often adjust lighting in a building according to occupancy schedules associated with the various areas of the building, which are often partitioned into lighting zones. By controlling lights according to these schedules, lighting control systems can, in some installations, reduce energy costs associated with lighting by over 50%. Lighting control systems may also be used with occupancy sensors to control building lighting based on actual occupancy of areas of the building.

Lighting control systems provide additional benefits. For example, lighting control systems can increase the longevity of lamps and ballasts by reducing the number of burn hours incurred over a period of time. In addition, lighting control systems can be used to comply with many building code requirements.

SUMMARY OF THE INVENTION

Aspects in accord with the present invention demonstrate an appreciation that the administrative burden associated with lighting control systems is significant. To help ease this burden, various examples provide for innovative approaches to install and configure elements of a lighting control system. For instance, in at least one example, a lighting control system includes a lighting system controller that is configured to automatically discover lighting controllers and configure the lighting controllers according to a centralized configuration.

In a particular example, the lighting system controller is configured to scan a network for lighting controllers that match a set of search criteria. The search criteria may be defined by a user and may specify characteristics common to one or more lighting controllers. In addition, according to this example, the lighting system controller is arranged to automatically configure a discovered lighting controller. This automatic configuration activity may include modifying the configuration of the discovered lighting controller to match configuration information stored locally on the lighting system controller. Conversely, this automatic configuration activity may include modifying the locally stored configuration information to match the current configuration of the discovered lighting controller. In some examples, the lighting system controller is configured to use cyclic redundancy checks when determining whether to modify configuration information.

According to one example, a method for managing a configuration of a lighting controller using a lighting system controller is provided. The method includes acts of requesting, by the lighting system controller, a first plurality of cyclic redundancy checks from the lighting controller, receiving, by the lighting system controller, the first plurality of cyclic redundancy checks from the lighting controller, the first plurality of cyclic redundancy checks being representative of first configuration data stored on the lighting controller, comparing, by the lighting system controller, the first plurality of cyclic redundancy checks from the lighting controller with a second plurality of cyclic redundancy checks stored on the lighting system controller to produce a comparison result, the second plurality of cyclic redundancy checks being representative of second configuration data stored on the lighting system controller and synchronizing, based on the comparison result, the first configuration data with the second configuration data.

In the method, the act of synchronizing may include an act of requesting a synchronization method from an external entity. In addition, the act of requesting a synchronization method from the external entity may include an act of requesting the synchronization method from at least one of a user and a system. Further, the act of requesting a synchronization method may include an act of presenting an indication of at least one of a send configuration method and a retrieve configuration method.

The method may also include acts of receiving, responsive to requesting the synchronization method, a request for the send configuration method and providing, responsive to receiving the request for the send configuration method, the second configuration data to the lighting controller. In addition the method may include acts of receiving, responsive to requesting the synchronization method, a request for the retrieve configuration method and requesting, responsive to receiving the request for the retrieve configuration method, the first configuration data from the lighting controller.

In the method, the act of synchronizing may includes acts of determining a first portion of the first configuration data to synchronize with a second portion of the second configuration data based on the comparison result and synchronizing only the first portion and the second portion. In addition, the act of determining the first portion may includes acts of determining that the first portion and the second portion are associated with a category of configuration information, determining that the first portion is associated with a first cyclic redundancy check of the first plurality of cyclic redundancy checks, determining that the second portion is associated with a second cyclic redundancy check of the second plurality of cyclic redundancy checks and determining that the first cyclic redundancy check is not equal to the second cyclic redundancy check. Further, the act of determining that the first portion and the second portion are associated with a category of configuration information may include an act of reading a map associating cyclic redundancy checks with categories of configuration information. Moreover, the method may also include an act of synchronizing the first plurality of cyclic redundancy checks with the second plurality of cyclic redundancy checks.

According to another example, a lighting system controller is provided. The lighting system controller includes a network interface, a memory and a controller coupled to the network interface and the memory. The controller is configured to request, via the network, a first plurality of cyclic redundancy checks from a lighting controller, receive, via the network, the first plurality of cyclic redundancy checks from the lighting controller, the first plurality of cyclic redundancy checks being representative of first configuration data stored on the lighting controller, compare the first plurality of cyclic redundancy checks from the lighting controller with a second plurality of cyclic redundancy checks stored on the lighting system controller to produce a comparison result, the second plurality of cyclic redundancy checks being representative of second configuration data stored on the lighting system controller and synchronize, based on the comparison result, the first configuration data stored on the lighting controller with the second configuration data stored on the lighting system controller.

In the lighting system controller, the controller configured to synchronize may be further configured to request a synchronization method from an external entity. In addition, the controller configured to request a synchronization method may be further configured to present an indication of at least one of a send configuration method and a retrieve configuration method. Moreover, the controller may be further configured to receive, responsive to the request for the synchronization method, a request for the send configuration method and provide, responsive to the request for the send configuration method, the second configuration data to the lighting controller.

According to the lighting system controller, the controller may be further configured to receive, responsive to the request the synchronization method, a request for the retrieve configuration method and request, responsive to the request for the retrieve configuration method, the first configuration data from the lighting controller. In addition, the controller configured to synchronize may be further configured to determine a first portion of the first configuration data to synchronize with a second portion of the second configuration data based on the comparison result and synchronize only the first portion and the second portion. Moreover, the controller configured to determine the first portion may be further configured to determine that the first portion and the second portion are associated with a category of configuration information, determine that the first portion is associated with a first cyclic redundancy check of the first plurality of cyclic redundancy checks, determine that the second portion is associated with a second cyclic redundancy check of the second plurality of cyclic redundancy checks and determine that the first cyclic redundancy check is not equal to the second cyclic redundancy check. Furthermore, the controller configured to determine that the first portion and the second portion are associated with a category of configuration information may be further configured to read a map associating cyclic redundancy checks with categories of configuration information. Additionally, the controller may be further configured to synchronize the first plurality of cyclic redundancy checks with the second plurality of cyclic redundancy checks.

In another example, a lighting system controller is provided. The lighting system controller includes a network interface, a memory and a mechanism for synchronizing configuration information stored on the lighting system controller with configuration information stored on a lighting controller.

Still other aspects, examples, and advantages of these exemplary aspects and examples, are discussed in detail below. Any example disclosed herein may be combined with any other example in any manner consistent with at least one of the objects, aims, and needs disclosed herein, and references to "an example," "some examples," "an alternate example," "various examples," "one example," "at least one example," "this and other examples" or the like are not necessarily mutually exclusive and are intended to indicate that a particular feature, structure, or characteristic described in connection with the example may be included in at least one example. The appearances of such terms herein are not necessarily all referring to the same example. The accompanying drawings are included to provide illustration and a further understanding of the various aspects and examples, and are incorporated in and constitute a part of this specification. The drawings, together with the remainder of the specification, serve to explain principles and operations of the described and claimed aspects and examples.

BRIEF DESCRIPTION OF DRAWINGS

Various aspects of at least one example are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

DETAILED DESCRIPTION

Figure 1:
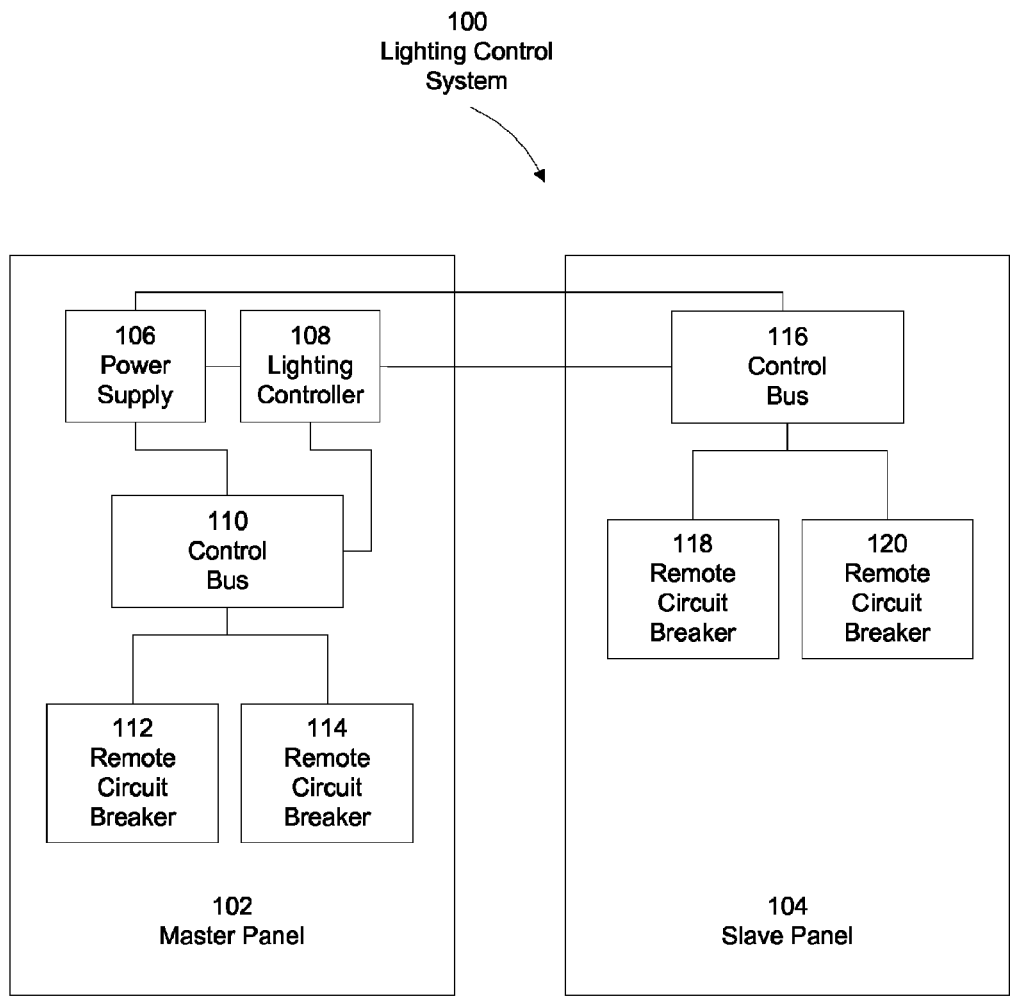
FIG. 1 is a block diagram of an example of a lighting control system.

At least some aspects and examples relate to apparatus and processes that allow lighting control system administrators to easily configure and maintain lighting control systems and their constituent lighting controllers. For instance, in one example a lighting control system includes a lighting system controller that can automatically discover one or more lighting controllers through a network interconnecting the lighting system controller and the lighting controllers. In another example, a lighting system controller can determine whether the configurations stored locally within one or more lighting controllers are equivalent to the configurations stored within the lighting system controller. In this example, the lighting system controller can also resolve any discrepancies between the configurations stored on the lighting controllers and the configurations stored on the lighting system controller by synchronizing both sets of configuration data.

Examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. In particular, acts, elements and features discussed in connection with any one or more examples are not intended to be excluded from a similar role in any other examples.

Also, the phraseology and terminology used herein is for the purpose of description and should not be regarded as limiting. Any references to examples or elements or acts of the apparatus and methods herein referred to in the singular may also embrace examples including a plurality of these elements, and any references in plural to any example or element or act herein may also embrace examples including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present apparatus and methods or their components to any one positional or spatial orientation.

Lighting Control Systems

The lighting control systems disclosed herein provide a variety of features that allow for precise control of lighting and other controlled loads. In some examples, lighting control systems includes inputs that can interface with external control devices such as external time clocks, access readers, photocell controls, occupancy sensors and other building automation or security systems to exchange (i.e. receive or provide) information pertaining to the power control activities of the lighting control system. In at least one such example, the lighting control system is configured to activate or deactivate lights upon receipt of a notification (such as a dry-contact closure or a digital serial communication) from an external control device (such as a time clock). In other examples, the lighting control system includes a time clock and scheduler and may be configured to perform power control functions according to a default schedule and to adjust these power control functions to account for special events, daylight saving time and sunrise and sunset times for particular geographic locations. One example of a lighting control system 100 that may be configured to include these features is illustrated in FIG. 1.

As shown, the lighting control system 100 includes a master panel 102 and a slave panel 104. The master panel 102 includes a power supply 106, a lighting controller 108, a control bus 110 and remote circuit breakers 112 and 114. The slave panel 104 includes a control bus 116 and remote circuit breakers 118 and 120. In the arrangement shown, the master panel 102 controls the power supplied to various controlled loads (such as lights) via itself and the slave panel 104.

More particularly, in the example of FIG. 1, the power supply 106 provides operating power to the lighting controller 108 and the control busses 110 and 116. In addition, the lighting controller 108 includes facilities configured to control the operation of the remote circuit breakers 112, 114, 118 and 120 via the control busses 110 and 116. As shown, the lighting controller 108 transmits control signals to the control busses 110 and 116. These control signals may be transmitted via data cable (such as 4-wire, Class 1 communications cable).

Continuing this example, the control busses 110 and 116 receive operating power from the power supply 106 and control signals from the lighting controller 108. The control busses 110 and 116, in turn, further distribute the control signals (for example, via switching signals) and operating power to the remote circuit breakers 112, 114, 118 and 120. The remote circuit breakers 112, 114, 118 and 120 receive the operating power and the control signals from the control busses 110 and 116 and control the flow of power used by the controlled loads according to the control signals. In some examples, the remote circuit breakers 112, 114, 118 and 120 control the flow of power used by the controlled loads by completing or breaking a circuit including the controlled load and the source of power to the controlled load. In these examples, the source of power to the controlled load is the main power feed for the facility in which the lighting control system installed, such as a utility power feed. Thus, the lighting control system 100 provides for centralized control of controlled loads by the lighting controller 108.

The components depicted in FIG. 1 may be selected from many suitable lighting control system components known in the art. In one example, the power supply 106, the lighting controller 108, the control busses 110 and 116 and the remote circuit breakers 112, 114, 118 and 120 are Square D® Powerlink® brand lighting control system components available from Schneider Electric. However, other examples may use other components and examples are not limited to a particular component or component manufacturer.

Lighting System Controller

Figure 2:
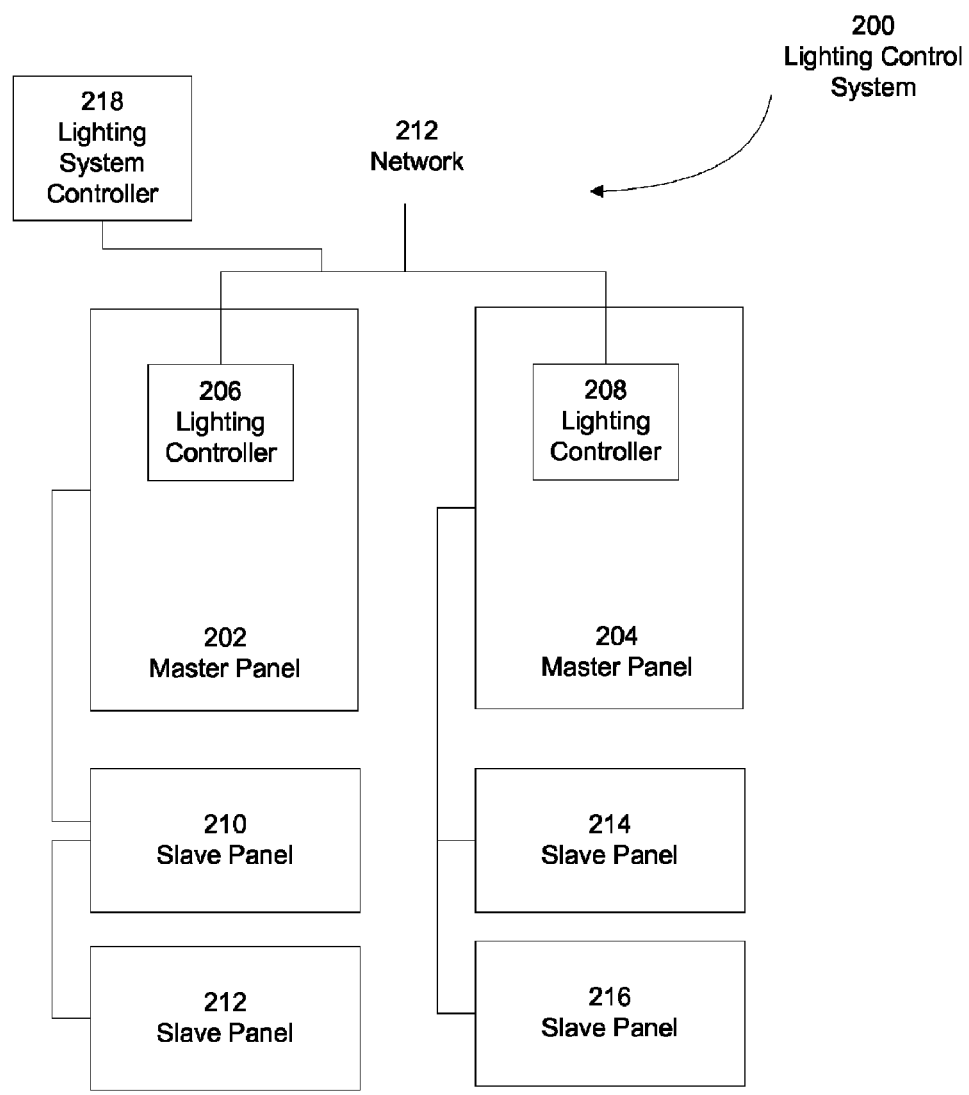
FIG. 2 is a block diagram of another example of a lighting control system.

FIG. 2 illustrates a more sophisticated lighting control system 200 that includes a lighting system controller 218, a network 212, master panels 202 and 204 and slave panels 210, 212, 214 and 216. The lighting control system 200 is one example of a system that is specially configured to perform the functions disclosed herein. However, the system structure and content recited with regard to FIG. 2 are for exemplary purposes only and are not intended to limit other examples to the specific structure shown in FIG. 2. As will be apparent to one of ordinary skill in the art, many variant system structures can be architected without deviating from the substance of the examples disclosed herein. As shown, the master panels 202 and 204 respectively include lighting controllers 206 and 208. The remaining details of the master panels 202 and 204 and the slave panels 210, 212, 214 and 216 are not shown, but these panels are arranged, and function, in the manner discussed above regarding master panel 102 and slave panel 104.

According to this example, the lighting system controller 218 is coupled to the lighting controllers 206 and 208 by the network 212. The network 212 may include any communication network through which lighting control system components may exchange data. Particular examples of networking standards that the network 212 may support include communication protocols such as C-BUS™ and TCP/IP over Ethernet and serial protocols, such as Modbus® ASCII/RTU, DMX512 and JCI-N2. In various examples, the light system controller 218 exchanges a variety of information with the lighting controllers 206 and 208 using the network 212. In some examples discussed further below, the information exchanged includes power monitoring and configuration information, among other information.

In the example shown, the lighting system controller 218 includes elements configured to exchange and store a variety of information with the lighting controllers 206 and 208 or with external entities (such as users and other systems). Examples of the types of information that may be so exchanged include monitoring information, control information, diagnostic information, maintenance information and configuration information. The monitoring information may include detailed circuit breaker, zone, input, schedule and remote source information for each panel, such as the panel name and layout, circuit breaker names and numbers, and the current status of the circuit breaker (for example, ON, OFF or tripped). The control information may include information to activate or deactivate command zone overrides and inputs. The diagnostics information may include a panel summary that displays the panel address, control bus names, numbers, firmware versions and current operating states. In addition the diagnostic information may include a lighting controller summary that includes model number, firmware version, time clock information, communications status and information regarding the current operating environment. The maintenance information may include product support and technical support contact information. The configuration information, which is discussed in more detail below, may include any information used by the lighting system controller 218 to configure itself, or configuration information associated with managed lighting controllers, such as lighting controllers 206 and 208.

Figure 3:
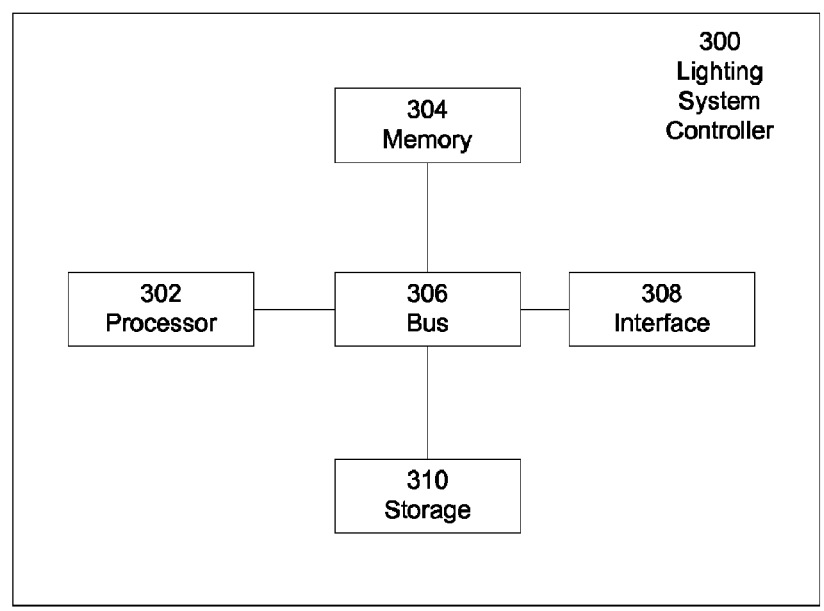
FIG. 3 is a block diagram of an example lighting system controller within which various aspects in accord with the present invention may be implemented.

FIG. 3 shows a more detailed example of a lighting system controller 300. As shown, the lighting system controller 300 includes hardware and software specially configured to perform the various aspects and functions described herein. In this example, the lighting system controller 300 includes a processor 302, a memory 304, a bus 306, an interface 308 and a storage 310. The processor 302 can perform a series of instructions that result in manipulated data. The processor 302 may be a commercially available processor such as an Intel Xeon, Itanium, Core, Celeron, Pentium, AMD Opteron, Sun UltraSPARC, IBM Power5+, or IBM mainframe chip, but may be any type of processor, multiprocessor or controller. The processor 302 is connected to other system elements, including one or more memory devices 304, by the bus 306.

The memory 304 may be used for storing programs and data used during operation of the lighting system controller 300. The memory 304 may include any volatile or non-volatile storage device, such as a dynamic random access memory or a disk drive. Various examples may organize the memory 304 into particularized and, in some cases, unique structures to perform the functions disclosed herein.

Components of the lighting system controller 300 may be coupled by an interconnection element such as the bus 306. The bus 306 may include one or more physical busses, for example, busses between components that are integrated within a same machine, but may include any communication coupling between system elements including specialized or standard computing bus technologies such as IDE, SCSI, PCI and InfiniBand. Thus, the bus 306 enables communications, for example, data and instructions, to be exchanged between system components of the lighting system controller 300.

The lighting system controller 300 also includes one or more interfaces 308 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, serial ports, etc. In at least one example, the lighting system controller 300 includes an RS-485 port, an RS-232 port and an Ethernet card. Interface devices allow the lighting system controller 300 to exchange information and communicate with external entities, such as users and other systems.

The storage system 310 may include a computer readable and writeable nonvolatile data storage medium in which instructions are stored that define a program that may be executed by the processor 302. The storage system 310 also may include information that is recorded, on or in, the medium, and this information may be processed by the processor 302 during execution of the program. More specifically, the information may be stored in one or more data structures specifically configured to conserve storage space or increase data exchange performance. The instructions may be persistently stored as encoded signals, and the instructions may cause the processor 302 to perform any of the functions described herein. The medium may, for example, be optical disk, magnetic disk or flash memory, among others. In operation, the processor 302 or some other controller may cause data to be read from the nonvolatile recording medium into another memory, such as the memory 304, that allows for faster access to the information by the processor 302 than does the storage medium included in the storage system 310. The memory may be located in the storage system 310 or in the memory 304, however, the processor 302 may manipulate the data within the memory 304, and then copy the data to the medium associated with the storage system 310 after processing is completed. A variety of components may manage data movement between the medium and integrated circuit memory element and examples is not limited thereto. Further, examples are not limited to a particular memory system or storage system.

Although the lighting system controller 300 is shown by way of example as one type of system upon which various aspects and functions may be practiced, aspects are not limited to being implemented on the lighting system controller 300 as shown in FIG. 3. Various aspects and functions may be practiced on one or more lighting system controllers having different architectures or components than those shown in FIG. 3. For instance, the lighting system controller 300 may include specially programmed, special-purpose hardware, such as for example, an application-specific integrated circuit (ASIC) tailored to perform a particular operation disclosed herein.

The lighting system controller 300 may include an operating system that manages at least a portion of the hardware elements included in the lighting system controller 300. Usually, a processor or controller, such as the processor 302, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating systems available from various sources. Many other operating systems may be used, and examples are not limited to any particular implementation.

The processor 302 and operating system together define a computer platform for which application programs in high-level programming languages may be written. These component applications may be executable, intermediate, bytecode or interpreted code which communicates over a communication network, for example, the Internet, using a communication protocol, for example, TCP/IP. Similarly, aspects may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions may be implemented in a non-programmed environment, for example, documents created in HTML, XML or other format that, when viewed in a window of a browser program, render aspects of a graphical-user interface or perform other functions. Further, various examples may be implemented as programmed or non-programmed elements, or any combination thereof. For example, a web page may be implemented using HTML while a data object called from within the web page may be written in C++. Thus, the examples are not limited to a specific programming language and any suitable programming language could be used. Thus, functional components disclosed here may include a wide variety of facilities, e.g. executable code, data structures or objects, configured to perform their described functions.

As discussed above with regard to FIG. 2, a lighting system controller, such as lighting system controller 300, can exchange configuration information with lighting controllers and external entities. Configuration information may include any information used to affect the operational behavior of a lighting system controller or a lighting controller. In some examples, the lighting system controller 300 can store configuration information in a variety of data structures, such as objects, that represent lighting control system elements. In at least one example, objects are organized and stored within the memory 304 or the storage 310. Examples of these objects include inputs, zones, schedules, clocks, alarms, control busses, remote circuit breakers, lighting controllers and lighting system controllers. Each of these objects has a variety of properties and may include other, nested objects. For example, the object that represents lighting controllers includes other configurable objects representing communication protocols used by the lighting controller, identification information for the lighting controller and email configuration information for the lighting controller. As is discussed further below, objects and other configuration information may be used to update the operational parameters of managed lighting controllers.

Referring back to the example illustrated in FIG. 2, the lighting system controller 218 also includes elements that are configured to automatically discover lighting controllers, such as the lighting controllers 206 and 208. In various examples, some of these elements can scan a network, such as the network 212, for available lighting controllers using ARP, pings or higher level application interface calls. In these examples, lighting controllers, such as the lighting controllers 206 and 208, can respond appropriately given the type of communication issued by the lighting system controller 218. In many of these examples, the lighting controllers 206 and 208 include characteristics about themselves within the responses. The characteristics of the lighting controllers that may be contained within the responses include the manufacturer of the lighting control, the lighting controller model, the serial number of the lighting controller, the version of firmware currently installed and optional hardware or software present in the lighting controller.

In some examples, the lighting system controller 218 can narrow its discovery activities using specified search information. In these examples, the lighting system controller 218 is configured to provide one or more interfaces through which the lighting system controller 218 can receive the search information from external entities. This search information may include one or more search criteria that specify one or more characteristics of lighting controllers. In at least one example, the lighting system controller 218 can store the search information locally and conduct a search of the network 212 for any lighting controllers that match the search information.

In a particular example, the lighting system controller 218 is configured to provide an interface that can accept a range of TCP/IP addresses. In this example, the lighting system controller 218 is also configured to store any TCP/IP address received through this interface in local storage. In addition, the lighting system controller 218 is further configured to search the network 212 for lighting controllers with a TCP/IP address that falls within the specified range. Thus, the lighting system controller 218 can issue pings to, for example, the IP addresses of lighting controllers 206 and 208. In this example, the lighting controllers 206 and 208 are configured to respond to the pings, thus notifying the lighting system controller 218 of their existence on the network 212.

According to this example, the lighting system controller 218 is also configured to present one or more interfaces through which the lighting system controller 218 can receive indications of which discovered lighting controllers it should manage. In addition, the lighting system controller 218 can locally store identification information for any lighting controllers selected for management via these interfaces. Thereafter, external entities may centrally administer these lighting controllers by using the facilities provided by the light system controller 218.

According to other examples, the lighting system controller 218 includes elements arranged to configure a lighting controller, such as the lighting controllers 206 and 208, with the configuration information. In one example, the lighting system controller 218 configures the lighting controllers 206 and 208 by providing the locally stored configuration information to the lighting controllers 206 and 208 via the network 212. In this example, the lighting controllers 206 and 208 receive and apply the configuration information to one or more operational parameters. Thereafter, the lighting controllers 206 will operate according to the values applied to their operation parameters.

With continued reference to FIG. 2, the lighting system controller 218 includes elements arranged to automatically synchronize the configuration of a lighting controller, such as the lighting controller 206, with configuration information stored locally on the lighting system controller 218. In one example, the lighting system controller 218 is configured to provide one or more interfaces through which the lighting system controller 218 can issue a health check request and, in response, receive cyclic redundancy check information from the lighting controller 206. As used herein, the term "health check" may be defined as any process that ascertains aspects of the operational state of a lighting controller. In this example, interfaces provided by the lighting system controller 218 can request a health check in response to a request by an external entity or automatically according to a periodic schedule. In addition, as is discussed further below, the cyclic redundancy check information returned in response to a health check request is representative of the underlying configuration information currently in use by the lighting controller 206.

Continuing this example, the lighting controller 206 is configured to provide at least one reciprocal interface through which the lighting controller 206 can receive a health check request and, in response, provide the cyclic redundancy check information. Further, in this example, the lighting system controller 218 is configured to compare the cyclic redundancy check information received from the lighting controller 206 to cyclic redundancy check information representative of configuration information associated with the lighting controller 206 that is stored locally on the lighting system controller 218. In at least one example, which is discussed further below, the comparison encompasses a plurality of comparisons of a plurality of discrete cyclic redundancy checks, each of which is associated with a discrete category of configuration information. Based on the comparison, the lighting system controller 218 can determine if the current configuration of the lighting controller 206 is in sync with the corresponding configuration information that is stored locally on the lighting system controller 218. In at least one example, the lighting system controller 218 is configured to determine that the sets of configuration information are in sync when the cyclic redundancy checks that represent the configuration information are equal. Further, in at least one example, the lighting system controller 218 is configured to synchronize the locally stored configuration information (and, in one example, the cyclic redundancy check information itself) with the current configuration of the lighting controller 206 in response to determining that cyclic redundancy checks that represent the respective configuration information are not equal. Thereby, the lighting system controller 218 can ease the administrative burden associated with maintaining proper operation of the lighting control system 200.

In one particular example, the lighting system controller 218 is configured to provide one or more interfaces through which the lighting system controller 218 can receive an indication of a synchronization method to use when synchronizing locally stored configurations with current configurations of lighting controllers. Examples of synchronization methods that the lighting system controller 218 is configured to perform include a send configuration method and a receive configuration method. In an example in accord with the send configuration method, the lighting system controller 218 is configured to provide one or more interfaces through which the lighting system controller 218 can provide locally stored configuration information to managed lighting controllers, such as the lighting controller 206. In this example, the lighting controller 206 is configured to provide a reciprocal interface to receive the configuration information and to reconfigure its operational parameters in accord with the values specified in the configuration information.

In an example in accord with the receive configuration method, the lighting system controller 218 is configured to provide one or more interfaces through which the lighting system controller 218 can receive, in response to a request, configuration information from the managed lighting controllers 206. In this example, the lighting controller 206 is configured to provide a reciprocal interface to provide its current configuration. In addition, in this example, the lighting system controller 218 is configured to update the locally stored configuration information corresponding to the configuration of the lighting controller 206 in accord with the received configuration information. Thus examples of the lighting system controller 218 provide flexibility with regard which configuration information takes precedence when resolving conflicts between instances of configuration information.

In some examples, the lighting system controller 218 can synchronize discrete portions of the overall configuration information associated with the managed lighting controller 206. In one such example, the lighting system controller 218 is configured to maintain a map that associates a list of discrete cyclic redundancy checks with a list of discrete categories of configuration information that when combined constitute a complete catalogue of configuration information for a lighting controller. In this example, the lighting system controller 218 is configured to perform a comparison between discrete cyclic redundancy checks of like categories. Further, the lighting system controller 218 is configured to synchronize configuration information associated with only those categories corresponding to cyclic redundancy checks that are not equal. In addition, according to this example, the lighting system controller 218 is configured to provide or receive configuration information targeted for synchronization, thereby making more efficient use of the resources of lighting control system 200.

The interfaces disclosed herein exchange information with various providers and consumers. These providers and consumers may include any external entity including, among other entities, users and systems. Each of the interfaces disclosed herein may both restrict input to a predefined set of values and validate any information entered prior to using the information or providing the information to other components. Additionally, each of the interfaces disclosed herein may validate the identity of an external entity prior to, or during, interaction with the external entity. These functions may prevent the introduction of erroneous data into the lighting control system 200 or unauthorized access to the lighting control system 200.

Configuration Synchronization Processes

Figure 4:
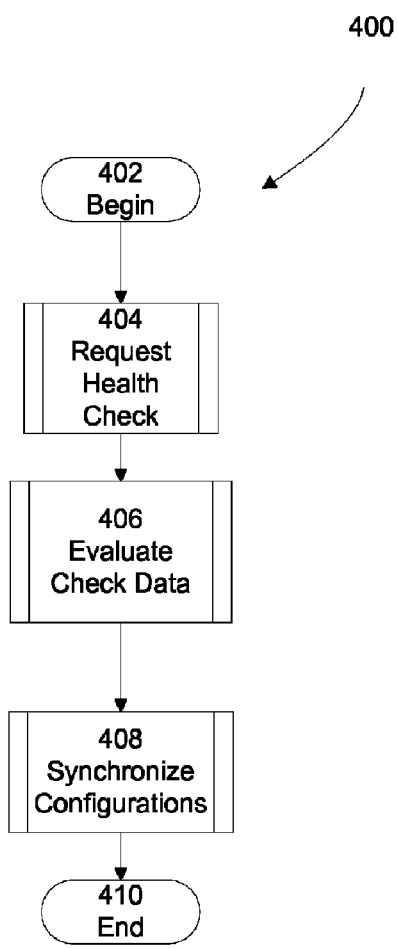
FIG. 4 is a flow chart of an example process for automated synchronization of a lighting controller system with a lighting controller in accord with aspects of the present invention.

Various examples provide processes for automated synchronization of the configurations of managed lighting controllers connected to a network using a lighting system controller. FIG. 4 illustrates one such process 400 that includes acts of requesting a health check, evaluating health check data and synchronizing the configuration of a managed lighting controller with a corresponding configuration stored elsewhere.

In act 404, a health check is requested. According to various examples, a lighting system controller transmits a health check request over a network to a managed lighting controller. Acts in accord with these examples are discussed below with reference to FIG. 5.

In act 406, health check data is evaluated. According to some examples, a lighting system controller evaluates the health check data returned by a managed lighting controller via a network. Acts in accord with these examples are discussed below with reference to FIG. 6.

In act 408, configuration information is synchronized. According to several examples, a lighting system controller works with a managed lighting controller to synchronize configuration information associated with the managed lighting controller. Acts in accord with these examples are discussed below with reference to FIG. 7.

Automated configuration synchronization processes in accord with process 400 decrease the level of effort required to properly maintain lighting control system configurations. Thus processes like process 400 decrease the total cost associated with operating a lighting control system.

Figure 5:
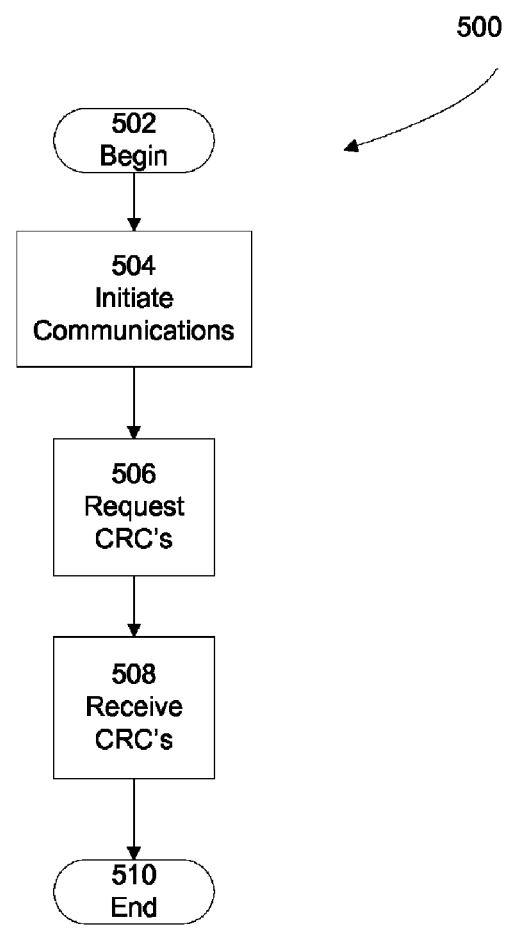
FIG. 5 is a flow chart of an example process for requesting a health check in accord with aspects of the present invention.

As discussed above with regard to act 404 shown in FIG. 4, various examples provide processes for requesting a managed lighting controller to perform a health check. FIG. 5 illustrates one such process 500 that includes acts of initiating communications with the managed lighting controller, requesting cyclic redundancy check information from the managed lighting controller and receiving, in response to the request, the cyclic redundancy check information from the managed lighting controller.

In act 504, a lighting system controller initiates communications with a managed lighting controller. In some examples, the lighting system controller that initiates the communication is arranged and configured in accord with the lighting system controller 300 as described above. In these examples, the lighting system controller initiates communications via a network such as the network 212 discussed above. In a particular example in which the network 212 supports TCP/IP, the lighting system controller initiates communications by opening a TCP/IP socket with the managed lighting controller.

In act 506, a lighting system controller requests cyclic redundancy check information from a managed lighting controller. In some examples, the lighting system controller that requests the cyclic redundancy check information is arranged and configured in accord with the lighting system controller 300 as described above. In these examples, the lighting system controller requests the cyclic redundancy check information by transmitting, to the managed lighting controller, a message requesting that the managed lighting controller perform a health check.

In act 508, a lighting system controller receives the cyclic redundancy check information from a managed lighting controller. In some examples, the lighting system controller that receives the cyclic redundancy check information is arranged and configured in accord with the lighting system controller 300 as described above. In these examples, the lighting system controller receives the cyclic redundancy check information via a response to a request for the managed lighting controller to perform a health check.

Various examples in accord with the process 500 enable lighting system controllers to gather cyclic redundancy check information representative of configuration information from one or more managed lighting controllers. By requesting and receiving cyclic redundancy check information representative of configuration information, rather than the more voluminous configuration information itself, examples in accord with the process 500 conserve network bandwidth.

Figure 6:
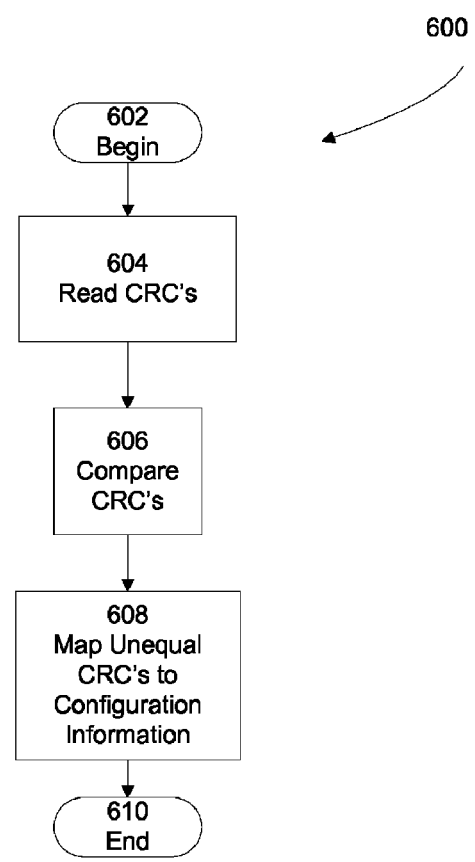
FIG. 6 is a flow chart of an example process for evaluating health check data in accord with aspects of the present invention.

As discussed above with regard to act 406 shown in FIG. 4, various examples provide processes for evaluating health check data returned by a managed lighting controller. FIG. 6 illustrates one such process 600 that includes acts of reading cyclic redundancy check information, comparing cyclic redundancy check information and mapping unequal cyclic redundancy check information to portions of configuration information.

In act 604, a lighting system controller reads locally stored cyclic redundancy check information associated with a managed lighting controller. In one example, the lighting system controller that reads the cyclic redundancy check information is arranged and configured in accord with the lighting system controller 300 as described above. In this example, the lighting system controller reads the cyclic redundancy check information representative of the locally stored lighting controller configuration.

In act 606, a lighting system controller compares the cyclic redundancy check information read from local storage to cyclic redundancy check information received from a managed lighting controller. In one example, the lighting system controller that compares the cyclic redundancy check information is arranged and configured in accord with the lighting system controller 300 as described above. In this example, the lighting system controller compares a first plurality of discrete cyclic redundancy checks with a second plurality of cyclic redundancy checks to determine which pairs compared cyclic redundancy checks of the pluralities are not equal.

In act 608, a lighting system controller maps unequal cyclic redundancy checks to configuration information. In one example, the lighting system controller that maps the unequal cyclic redundancy checks is arranged and configured to include a map of cyclic redundancy check information to configuration information, such as the map discussed above with regard to lighting system controller 218. In this example, the lighting system controller determines one or more portions of configuration information that require synchronization between the lighting system controller and the managed lighting controller.

Processes in accord with the process 600 allow a lighting system controller to identify mismatched portions of configuration information by comparing cyclic redundancy check information that is representative of the configuration information. This cyclic redundancy check comparison based method, in turn, allows for more efficient use of processing resources on the lighting system controller than would a complete comparison of the configuration information itself.

Figure 7:
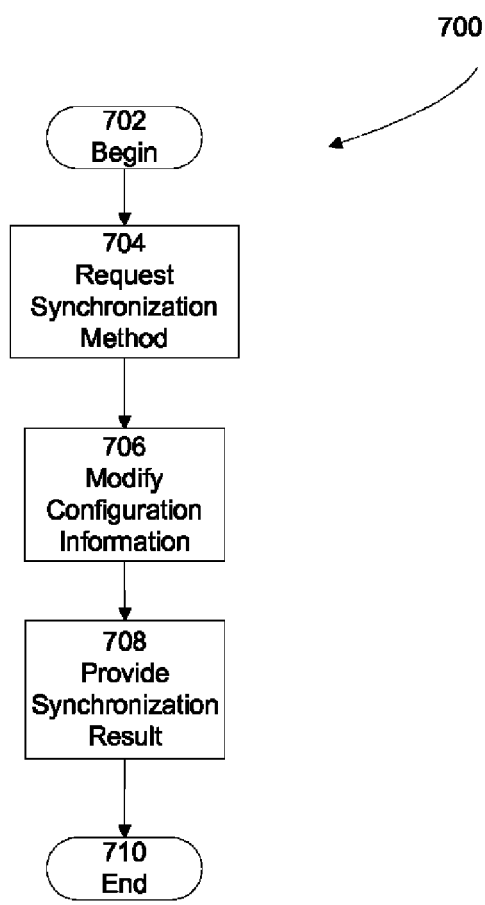
FIG. 7 is a flow chart of an example process for synchronizing configurations in accord with aspects of the present invention.

As discussed above with regard to act 408 shown in FIG. 4, various examples provide processes for a lighting system controller to synchronize locally stored configuration information with configuration information stored on a managed lighting controller. FIG. 7 illustrates one such process 700 that includes acts of requesting a synchronization method, modifying configuration information and providing a synchronization result.

In act 704, a lighting system controller requests a synchronization method. In some examples, the lighting system controller that requests the synchronization method is arranged and configured in accord with the lighting system controller 300 as described above. In these examples, the lighting system controller provides an interface to an external entity through which the lighting system controller can receive at least one synchronization method. In one particular example, the lighting system controller presents a user interface on a display coupled to the lighting system controller and receives, via an input such as a mouse or keyboard, a user selected synchronization method. In another example, the lighting system controller provides a system interface to another system coupled to the lighting system controller and receives, via an input such as a network interface, a system selected synchronization method.

In act 706, configuration information is modified. In several examples, the device that performs the modification depends on the synchronization method used. For example, if the send configuration method is applied, a managed lighting controller will modify its operational parameters to match configuration information received from a lighting system controller. In an example where the receive configuration method is used, a lighting system controller, such as the lighting system controller 300 discussed above, alters its configuration information to match configuration information received from a managed lighting controller. In either case, the changes made to the configuration information may be restricted to specific portions of the overall configuration information, i.e. only those portions associated with non-matching cyclic redundancy check information. In addition, in at least one example, the cyclic redundancy check information is also synchronized between the lighting system controller and one or more managed lighting controllers.

In act 708, a result of the synchronization process is provided. In some examples, the devices involved in providing the synchronization result depend on the synchronization method used. In an example where the send configuration method is used, a managed lighting controller provides a result indicating whether it successfully reconfigured its operational parameters in accord with configuration information received from a lighting system controller. In an example where the receive configuration method is used, a lighting system controller generates a result indicating whether it successfully stored configuration information received from a managed lighting controller. In either case, the lighting system controller also provides the synchronization result to the external entity that selected the synchronization method.

Upon completion of process 700, configuration information stored on a lighting system controller is synchronized with the configuration of one or more managed lighting controllers. As discussed above, processes such as process 700 make efficient use of lighting system controller and network resources when synchronizing configuration information by using cyclic redundancy check information to represent the configuration information rather than by processing the configuration information itself.

Figure 8:
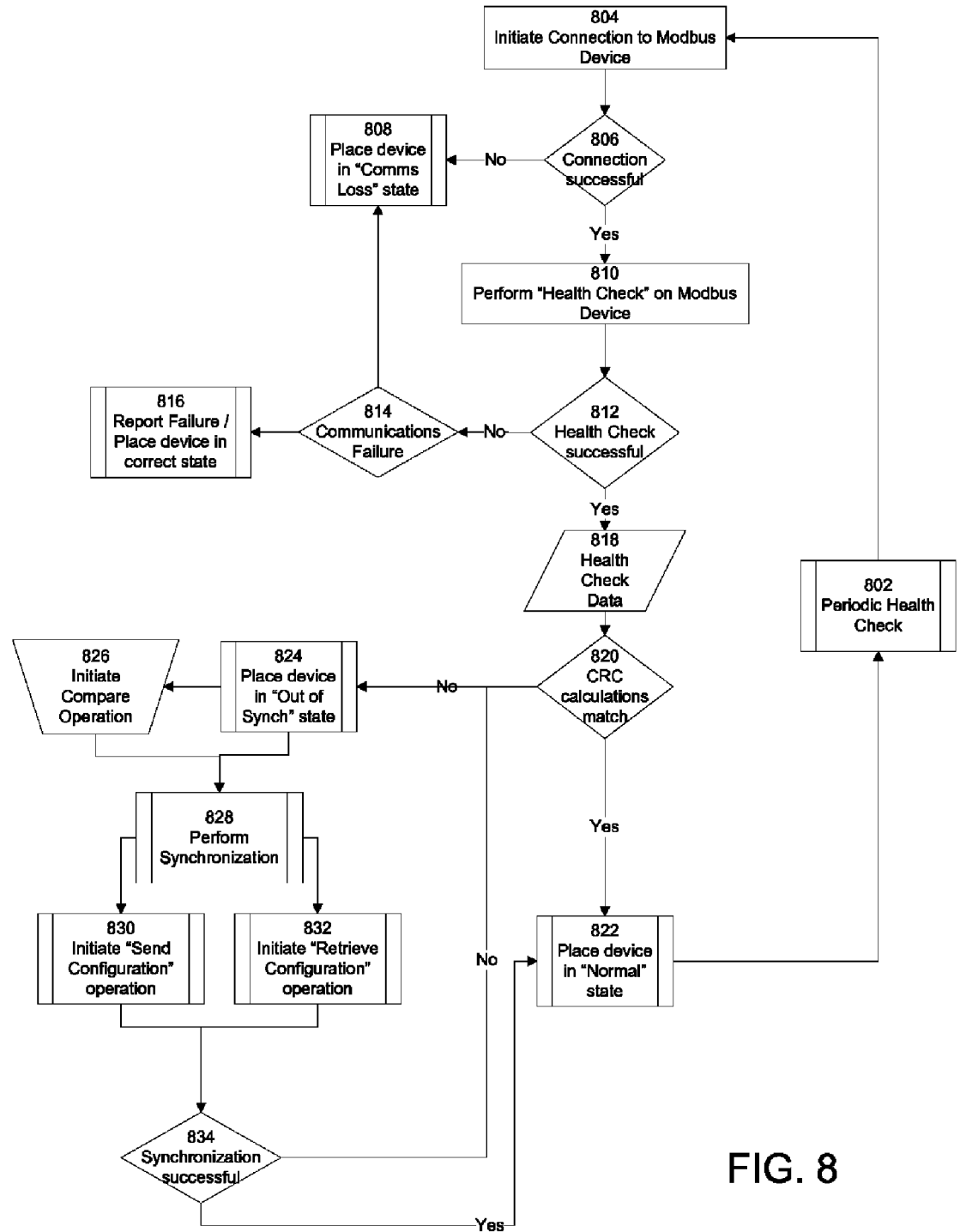
FIG. 8 is a flow chart of another example process for automated synchronization of a lighting controller system with a lighting controller in accord with aspects of the present invention.

Other example processes for automated synchronization of configuration information exist. FIG. 8 illustrates one such example process 800. Process 800 begins in 802 in which a period health check is requested by an external entity, such as a user or a scheduling program. In act 804, a lighting system controller initiates a connection to a device that uses a serial protocol, such as the Modbus® protocol, to communicate with other devices. In one example, the device is a lighting controller.

In act 806, the lighting system controller determines if the connection was successfully initiated. If not, the lighting system controller records the state of the lighting controller as "Comms Loss" in act 808. If the connection was successfully established, the lighting system controller requests that the Modbus® device perform a health check in act 810.

In act 812, the lighting system controller determines if the health check was successfully performed, and the results returned, by the Modbus® device. If not, the lighting system controller sets the state of the Modbus® device appropriately and reports the failure to an external entity in act 816. If the health check data is performed successfully and the health check data is returned to the lighting system controller, the lighting system controller locally stores the health check data in act 818.

In act 820, the lighting system controller compares cyclic redundancy check information returned in the health check data to cyclic redundancy check information locally stored on the lighting system controller. If the cyclic redundancy check information matches, the lighting system controller records the state of the Modbus® device as "Normal" in act 822. In act 824, if the cyclic redundancy check information does not match, the lighting system controller records the state of the Modbus® device as "Out of Synch" and provides, to the Modbus® device, the mismatching cyclic redundancy check information, an indicator of a synchronization method and, if the indictor indicates the send configuration method, configuration information associated with the mismatching cyclic redundancy check information.

In act 826, the Modbus® device maps the mismatching cyclic redundancy check information to associated configuration information. In act 828, the Modbus® device determines a synchronization process to perform. In act 830, the Modbus® device initiates a send configuration method, as discussed above, if the lighting system controller passed an indicator of the send configuration method. In act 832, the Modbus® device initiates a receive configuration method, again as discussed above, if the lighting system controller passed an indicator of the receive configuration method.

In act 834, the lighting system controller receives a result of the executed synchronization method from the Modbus® device. Additionally in act 834, if the receive configuration method was successfully executed, the lighting system controller receives configuration information associated with the mismatch cyclic redundancy check information and stores the configuration information locally. If the result indicates that the synchronization method was successfully executed, the lighting system controller executes act 822 as previously discussed.

Figure 9:
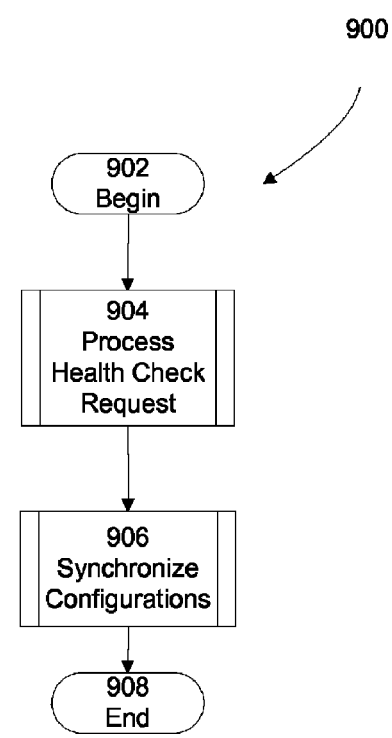
FIG. 9 is a flow chart of an example process for servicing synchronization requests in accord with aspects of the present invention.

Various examples provide processes for managed lighting controllers connected to a network to service synchronization requests transmitted by a lighting system controller. FIG. 9 illustrates one such process 900 that includes acts of processing a health check request and synchronizing configuration information.

In act 904, a health check request is processed. According to various examples, a managed lighting controller processes a health check request sent by a lighting system controller over a network. Acts in accord with these examples are discussed below with reference to FIG. 10.

In act 906, configuration information is synchronized. According to some examples, a managed lighting controller manipulates configuration information according to a selected synchronization method. Acts in accord with these examples are discussed below with reference to FIG. 11.

Processes in accord with process 900 enable managed lighting controllers to automatically synchronize their configuration with configuration information centrally stored on a light system controller. Thus processes like process 900 support the centralized management of managed lighting controllers, thereby lowering the total cost of operating a lighting control system.

Figure 10:
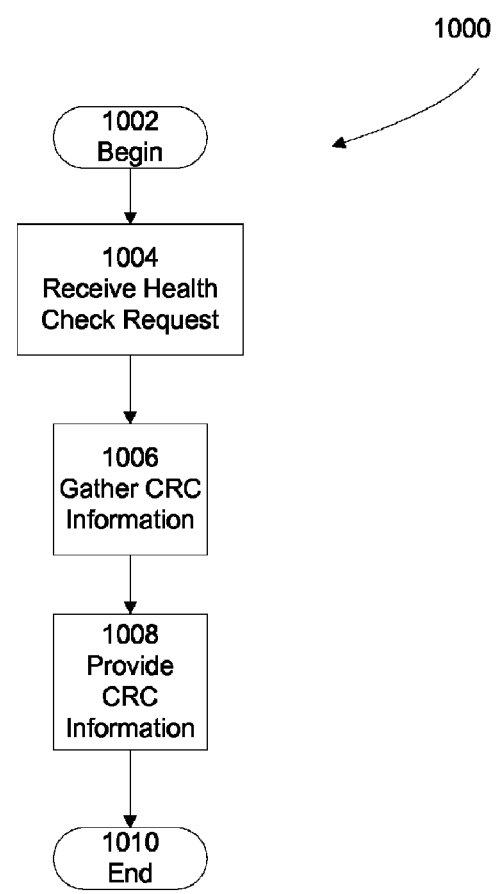
FIG. 10 is a flow chart of an example process for processing a health check request in accord with aspects of the present invention.

As discussed above with regard to act 904 shown in FIG. 9, various examples provide processes through which a managed lighting controller processes health check requests. FIG. 10 illustrates one such process 1000 that includes acts of receiving a health check request, reading cyclic redundancy check information and providing cyclic redundancy check information.

In act 1004, a managed lighting controller receives a health check request from a lighting system controller via a network. In some examples, where the network support TCP/IP communications, the managed lighting controller receives the health check request via a TCP/IP socket maintained between the managed lighting controller and the lighting system controller. In other examples, other communications protocols including serial protocols are used, and thus, examples are not limited to a specific communication protocol.

In act 1006, a managed lighting controller gathers cyclic redundancy check information. In one example, the managed lighting controller gathers the cyclic redundancy check information by reading cyclic redundancy check information held in local storage on the lighting controller. In another example, the managed lighting controller gathers the cyclic redundancy check information by generating the cyclic redundancy check information based on the current operational parameters of the lighting controller.

In act 1008, a managed lighting controller provides the cyclic redundancy check information to a lighting system controller. In these examples, the lighting controller provides the cyclic redundancy check information in response to a request from the lighting system controller to perform a health check. In other examples, the lighting controller provides the cyclic redundancy check information according to a pre-determined schedule.

Various examples in accord with the process 1000 enable a lighting controller to provide cyclic redundancy check information representative of its current configuration to a lighting system controller.

Figure 11:
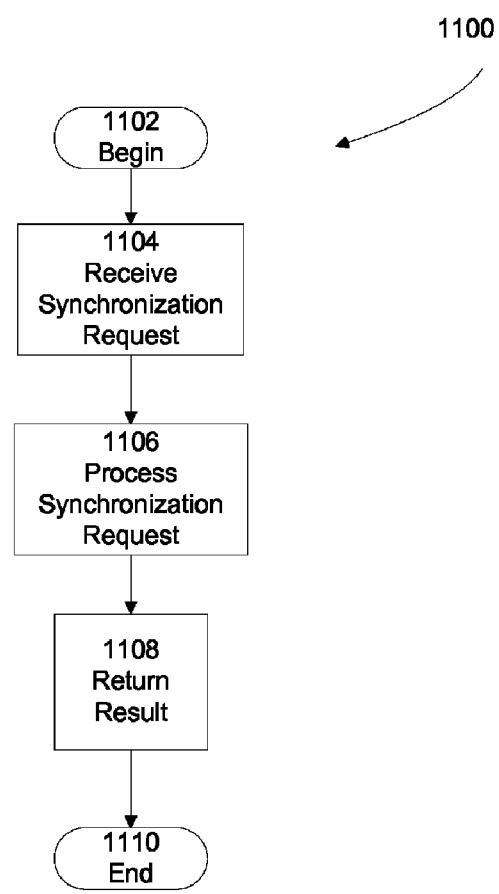
FIG. 11 is a flow chart of an example process for synchronizing configurations in accord with aspects of the present invention.

As discussed above with regard to act 906 shown in FIG. 9, various examples provide processes by which managed lighting controllers modify their configurations to match configuration information sent by a lighting system controller. FIG. 11 illustrates one such process 1100 that includes acts of receiving a synchronization request, processing the synchronization request and returning a synchronization result.

In act 1104, a managed lighting controller receives a synchronization request from a lighting system controller. According to various examples, the informational content of the synchronization request may vary, depending on the synchronization method requested. In one example, the content may include simply an indicator of the synchronization method requested. In another example, the content may include the indicator, cyclic redundancy check information (such as mismatching cyclic redundancy check information) and configuration information.

In act 1106, a managed lighting controller processes the synchronization request. In some examples, the managed lighting controller performs different actions based on the synchronization method requested. In one example directed toward the send configuration method, the managed lighting controller alters its operational parameters to match configuration information included in the synchronization request. In another example directed toward the receive configuration method, the managed lighting controller simply gathers configuration information corresponding to its current set of operational parameters or a subset of the operational parameters that are associated with mismatching cyclic redundancy check information.

In act 1108, a managed lighting controller returns a synchronization result to a lighting system controller. In various examples, the set of information returned by the managed lighting controller varies based on the synchronization method executed. In an example where the send configuration method was executed, the result simply indicates success or failure of synchronization operation. In an example where the receive configuration method was executed, the result indicates success or failure of the operation and configuration information representing the values of the operational parameters of the lighting controller. In another example where the receive configuration method was executed, the configuration information returned represent a subsets of the operational parameters of the managed lighting controller. This subset includes only operational parameters associated with mismatched cyclic redundancy check information.

Processes in accord with the process 1100 allow a managed lighting controller to synchronize its configuration with configuration information stored elsewhere. The synchronization may be accomplished by adjusting the operational parameters of the lighting controller or by providing configuration information representative of the operational parameters of the lighting controller. Thus, process 1100 provides a flexible approach to synchronization in which either the lighting system controller or the lighting controller may define the dominate configuration when settling conflicts between the configuration information included in both.

Figure 12:
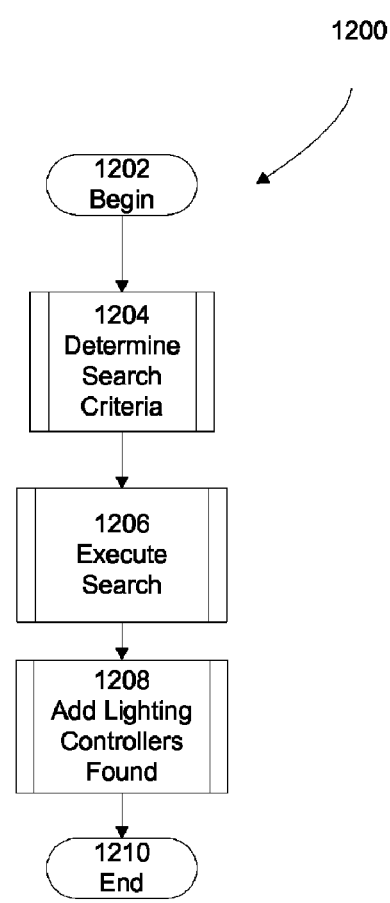
FIG. 12 is a flow chart of an example process for automated discovery of lighting controllers in accord with aspects of the present invention.

Various examples provide processes for automated discovery of lighting controllers connected to a network using a lighting system controller. FIG. 12 illustrates one such process 1200 that includes acts of determining search criteria, executing a search and adding discovered lighting controllers to a list of managed lighting controllers.

In act 1204, search criteria is determined. According to various examples, a lighting system controller determines the search criteria via an interface provided to an external entity. Acts in accord with these examples are discussed below with reference to FIG. 13.

In act 1206, a search is executed. According to some examples, a lighting system controller executes a search for lighting controllers attached to a network. Acts in accord with these examples are discussed below with reference to FIG. 14.

In act 1208, found lighting controllers are added to a list of managed lighting controllers. According to several examples, a lighting system controller adds discovered lighting controllers to a locally stored list of managed lighting controllers. Acts in accord with these examples are discussed below with reference to FIG. 15.

Automated discovery processes in accord with process 1200 decrease the level of effort required to identify lighting controllers that may be centrally managed via a lighting system controller. Thus processes like process 1200 decrease the total cost associated with operating a lighting control system.

Figure 13:
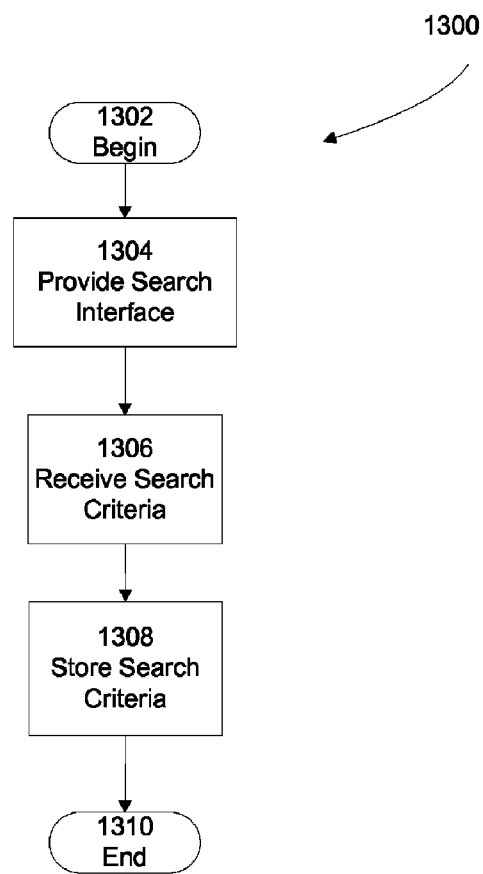
FIG. 13 is a flow chart of an example process for determining search criteria in accord with aspects of the present invention.

As discussed above with regard to act 1204 shown in FIG. 12, various examples provide processes by which a lighting system controller determines criteria to use in searching a network for lighting controllers to manage. FIG. 13 illustrates one such process 1300 that includes acts of providing a search interface, receiving search criteria and storing search criteria.

In act 1304, a lighting system controller provides a search interface to an external entity. In some examples, the lighting system controller that provides the interface is arranged and configured in accord with the lighting system controller 300 as described above. In one example, the lighting system controller presents a user interface in a display. In another example, the lighting system controller provides a system interface via network, such as network 212.

In act 1306, a lighting system controller receives search criteria from an external entity. In some examples, the lighting system controller that receives the search criteria is arranged and configured in accord with the lighting system controller 300 as described above. In these examples, the lighting system controller receives the search criteria through the search interface. Consequently, according to various examples, the lighting system controller may receive the search criteria through a user interface such as a keyboard or a mouse or through a system interface provided via a network, such as the network 212.

In act 1308, a lighting system controller locally stores the received search criteria. In some examples, the lighting system controller that receives the cyclic redundancy check information is arranged and configured in accord with the lighting system controller 300 as described above. In these examples, the lighting system controller stores the search criteria in memory 304 and, optionally, storage 310.

Various examples in accord with the process 1300 enable an external entity, such as a user, to create and store search criteria for later use in discovering lighting system controllers. This approach allows for commonly used search criteria to be reused on multiple occasions without having to re-input the criteria multiple times.

Figure 14:
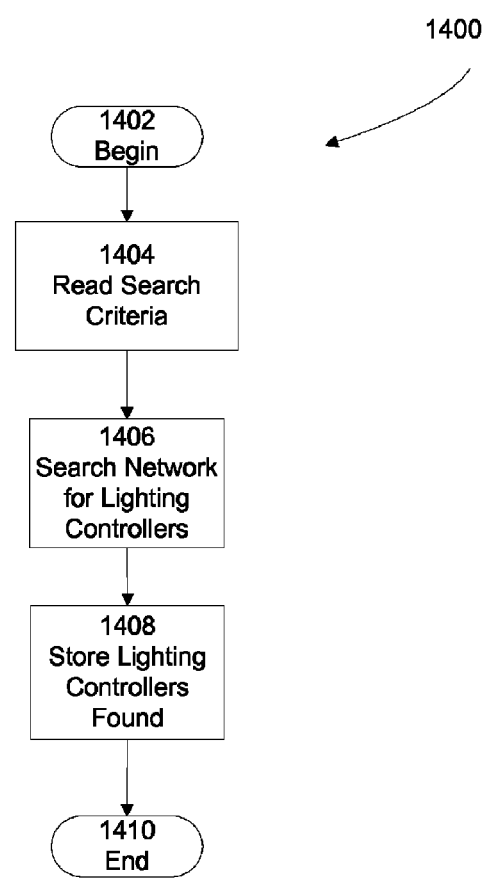
FIG. 14 is a flow chart of an example process for executing a search for lighting controllers in accord with aspects of the present invention.

As discussed above with regard to act 1206 shown in FIG. 12, various examples provide processes by which a lighting system controller searches a network for lighting controllers to manage. FIG. 14 illustrates one such process 1400 that includes acts of reading search criteria, searching a network for lighting controllers matching the search criteria and storing indications of lighting controllers discovered.

In act 1404, a lighting system controller reads locally stored search criteria. In one example, the lighting system controller that reads the search criteria is arranged and configured in accord with the lighting system controller 300 as described above. In one example, the search criteria specify one or more characteristics of a lighting controller such as, for example, a range of IP addresses.

In act 1406, a lighting system controller scans a network for lighting controllers that match the search criteria. In one example, the lighting system controller that scans the network is arranged and configured in accord with the lighting system controller 218 as described above. In addition, in this example, the network is arranged and configured in accord with the network 212 described above. In various examples, the lighting controller scans the network using a variety of methods. In at least one particular example, the lighting system controller issues pings for each IP address within a specified range of IP addresses to discover available lighting controllers.

In act 1408, a lighting system controller stores an indicator of each discovered lighting controller in storage. In some examples, the lighting system controller that stores the indicators is arranged and configured in accord with the lighting system controller 300 as described above. In these examples, the lighting system controller stores the indicators in memory 304 and, optionally, storage 310.

Processes in accord with the process 1400 allow a lighting system controller to search networks for lighting controllers based on specify search criteria. Thus examples in accord with process 1400 provide external entities with the ability to specify the characteristics of lighting controllers to centrally manage and thus advantageously narrow the scope of automated discovery.

Figure 15:
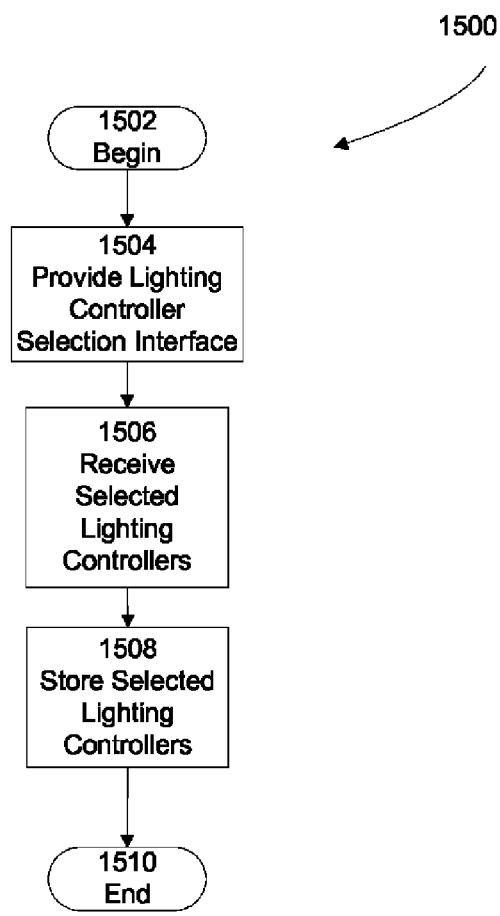
FIG. 15 is a flow chart of an example process for adding lighting controllers to a set of managed lighting controllers in accord with aspects of the present invention.

As discussed above with regard to act 1208 shown in FIG. 12, various examples provide processes for a lighting system controller to add newly discovered lighting controllers to a list of managed lighting controllers. FIG. 15 illustrates one such process 1500 that includes acts of providing an interface for selecting lighting controller to manage, receiving selected lighting controllers and storing the selected lighting controllers in local storage.

In act 1504, a lighting system controller provides, to an external entity, an interface for selecting available lighting controllers for centralized management by the lighting system controller. In some examples, the lighting system controller that provides the interface is arranged and configured in accord with the lighting system controller 300 as described above. In one example, the lighting system controller presents a user interface in a display. In another example, the lighting system controller provides a system interface via network, such as network 212.

In act 1506, a lighting system controller receives indications of controller selected by an external entity for management via the lighting system controller. In some examples, the lighting system controller that receives the indications is arranged and configured in accord with the lighting system controller 300 as described above. In these examples, the lighting system controller receives the indications through the selection interface described above in act 1504 and with regard to the lighting system controller 218. Consequently, according to various examples, the lighting system controller may receive the indications through a user interface such as a keyboard or a mouse or through a system interface provided via a network, such as the network 212.

In act 1508, a lighting system controller records the indicators of the selected lighting controllers in local storage. In some examples, the lighting system controller that stores the indicators is arranged and configured in accord with the lighting system controller 300 as described above. In these examples, the lighting system controller stores the indicators in memory 304 and, optionally, storage 310.

Upon completion of process 1500, lighting controllers that are available for efficient, centralized administration by a lighting system controller have been discovered. Processes such as process 1500 provide for increased installation ease of lighting controllers, allowing technical personal to focus on higher value-added activities.

Figure 16:
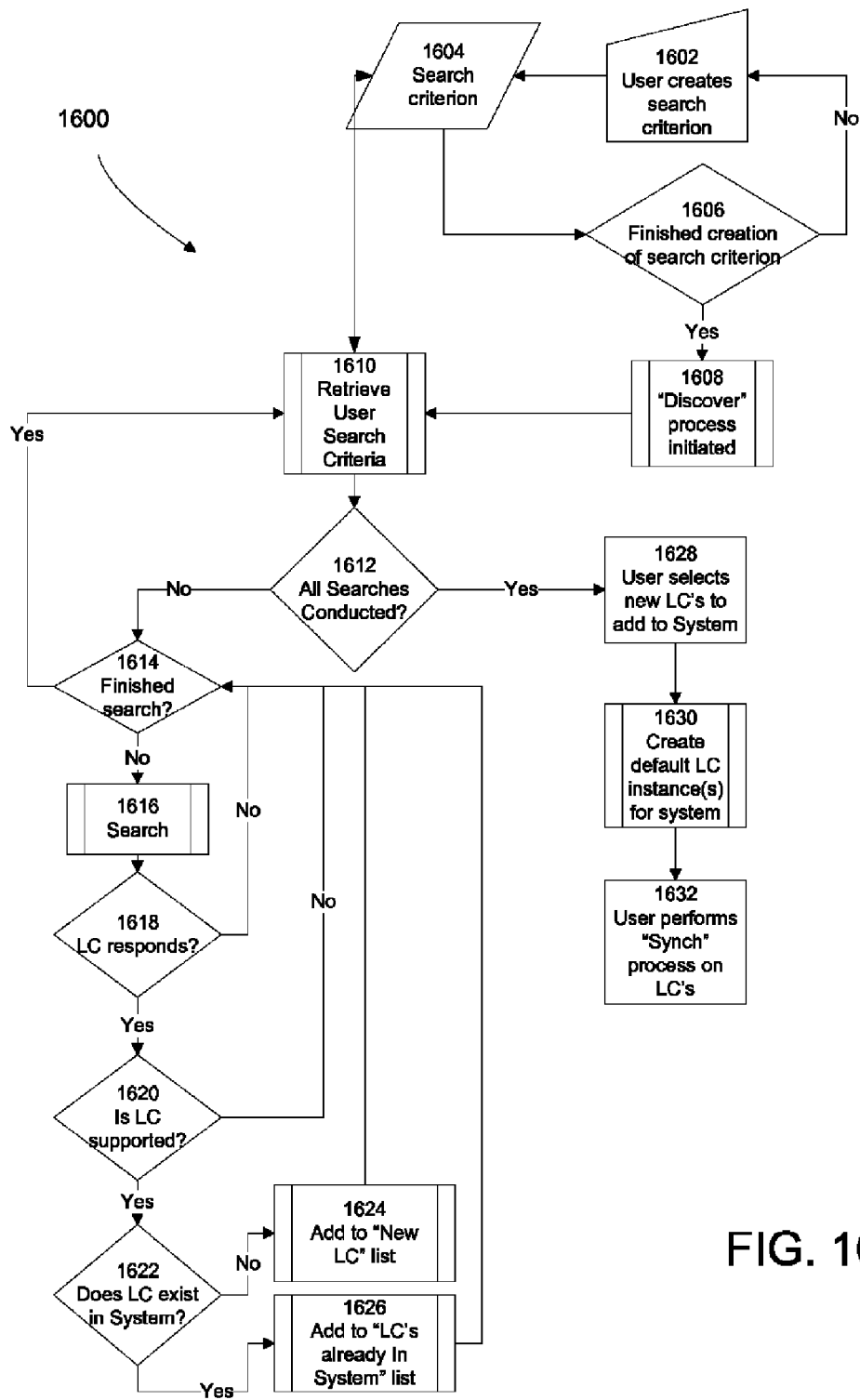
FIG. 16 is a flow chart of another example process for automated discovery of lighting controllers in accord with aspects of the present invention.

Other example processes for automated discovery of lighting controllers exist. FIG. 16 illustrates one such example process 1600. Process 1600 begins in act 1602 in which an external entity, such as a user, creates search criteria using the functions and interfaces described herein with regard to a lighting system controller. In act 1604, the created search criteria is stored locally on the lighting system controller.

In act 1606, the lighting system controller determines if the external entity is finished creating search criteria. If not, the lighting system controller allows the external entity to continue creating search criteria in act 1602. If the external entity is finished creating the search criteria and requests automated discovery, the lighting system controller initiates automated discovery in act 1608.

In act 1610, the lighting system controller retrieves a set of user selected search criteria from storage. In act 1612, the lighting system controller determines if searches corresponding to all of the user selected search criteria have been completed. If so, the lighting system controller provides an interface through which the user selects new lighting controllers to add to the list of managed lighting controllers in act 1628. For each newly added lighting controller, the lighting system controller creates and locally stores a default set of configuration information in act 1630. In act 1632, the user performs a periodic synchronization of each newly added lighting controller.

If, according to the results of act 1612, additional searches are required, the lighting system controller determines if the current search is complete in act 1614. If the current search is complete, the lighting system controller retrieves the next set of user selected search criteria from storage in act 1610. If the current search is not complete, the lighting controller finds the next lighting controller that matches the current set of search criteria in act 1616.

In act 1618, the lighting system controller attempts to initiate communications with the lighting controller identified in act 1616. If the lighting controller does not respond, the lighting system controller determines if the current search is complete in act 1614. If the lighting controller responds, the lighting system controller determines if it can manage the lighting controller in act 1620. According to one example, the lighting system controller makes this determination based on the model of the lighting controller and on the version of firmware which is installed on the lighting controller.

If the lighting system controller does not support the lighting controller, the lighting system controller determines if the current search is complete in act 1614. If the lighting system controller supports the lighting controller, the lighting system controller determines if the lighting controller is already a member of the set of managed lighting controllers. If the lighting controller is not a member of the set of managed lighting controllers, then the lighting system controller adds the lighting controller to a list of newly discovered lighting controllers in act 1624. If the lighting controller is a member of the set of managed lighting controllers, then the lighting system controller adds the lighting controller to a list of already managed lighting controller in act 1626. After either of acts 1624 and 1626 is complete, the lighting system controller determines if the current search is complete in act 1614.

Each of processes 400 through 1600 depicts one particular sequence of acts in a particular example. The acts included in each of these processes may be performed by, or using, one or more lighting system controllers as discussed herein. Some acts are optional and, as such, may be omitted in accord with one or more examples. Additionally, the order of acts can be altered, or other acts can be added, without departing from the scope of the apparatus and methods discussed herein. In addition, as discussed above, in at least one example, the acts are performed on a particular, specially configured machine, namely a lighting system controller configured according to the examples disclosed herein.

Having now described some illustrative aspects, it should be apparent to those skilled in the art that the foregoing is merely illustrative and not limiting, having been presented by way of example only. Similarly, aspects may be used to achieve other objectives. Numerous modifications and other illustrative examples are within the scope of one of ordinary skill in the art and are contemplated as falling within the scope of the apparatus and methods disclosed herein. In particular, although many of the examples presented herein involve specific combinations of method acts or system elements, it should be understood that those acts and those elements may be combined in other ways to accomplish the same objectives.

What is claimed is:

1. A method for managing a configuration of a lighting controller using a lighting system controller, the method comprising:
   requesting, by the lighting system controller, a first plurality of cyclic redundancy checks from the lighting controller;
   receiving, by the lighting system controller, the first plurality of cyclic redundancy checks from the lighting controller, the first plurality of cyclic redundancy checks being representative of first configuration data stored on the lighting controller;
   comparing, by the lighting system controller, the first plurality of cyclic redundancy checks from the lighting controller with a second plurality of cyclic redundancy checks stored on the lighting system controller to produce a comparison result, the second plurality of cyclic redundancy checks being representative of second configuration data stored on the lighting system controller;
   identifying, responsive to the comparison result indicating an inequality, a synchronization method selected from a plurality of synchronization methods; and
   synchronizing, based on the comparison result and the identified synchronization method, the first configuration data with the second configuration data.

2. The method according to claim 1, further comprising requesting an indication of the synchronization method from an external entity.

3. The method according to claim 2, wherein requesting the indication of the synchronization method from the external entity includes requesting the indication of the synchronization method from at least one of a user and a system.

4. The method according to claim 2, wherein requesting the indication of the synchronization method includes presenting an indication of at least one of a send configuration method and a retrieve configuration method.

5. The method according to claim 4, further comprising:
   receiving, responsive to requesting the indication of the synchronization method, a request for the send configuration method; and
   providing, responsive to receiving the request for the send configuration method, the second configuration data to the lighting controller.

6. The method according to claim 4, further comprising:
   receiving, responsive to requesting the indication of the synchronization method, a request for the retrieve configuration method; and
   requesting, responsive to receiving the request for the retrieve configuration method, the first configuration data from the lighting controller.

7. The method according to claim 1, wherein synchronizing includes:
   determining a first portion of the first configuration data to synchronize with a second portion of the second configuration data based on the comparison result; and
   synchronizing only the first portion and the second portion.

8. The method according to claim 7, wherein determining the first portion includes:
   determining that the first portion and the second portion are associated with a category of configuration information;
   determining that the first portion is associated with a first cyclic redundancy check of the first plurality of cyclic redundancy checks;
   determining that the second portion is associated with a second cyclic redundancy check of the second plurality of cyclic redundancy checks; and
   determining that the first cyclic redundancy check is not equal to the second cyclic redundancy check.

9. The method according to claim 8, wherein determining that the first portion and the second portion are associated with a category of configuration information includes reading a map associating cyclic redundancy checks with categories of configuration information.

10. The method according to claim 1, further comprising synchronizing the first plurality of cyclic redundancy checks with the second plurality of cyclic redundancy checks.

11. A lighting system controller comprising:
    a network interface;
    a memory; and
    a controller coupled to the network interface and the memory and configured to:

request, via the network, a first plurality of cyclic redundancy checks from a lighting controller;
receive, via the network, the first plurality of cyclic redundancy checks from the lighting controller, the first plurality of cyclic redundancy checks being representative of first configuration data stored on the lighting controller;
compare the first plurality of cyclic redundancy checks from the lighting controller with a second plurality of cyclic redundancy checks stored on the lighting system controller to produce a comparison result, the second plurality of cyclic redundancy checks being representative of second configuration data stored on the lighting system controller;
identify, responsive to the comparison result indicating an inequality, a synchronization method selected from a plurality of synchronization methods; and
synchronize, based on the comparison result and the identified synchronization method, the first configuration data stored on the lighting controller with the second configuration data stored on the lighting system controller.

12. The lighting system controller according to claim 11, wherein the controller is further configured to request an indication of the synchronization method from an external entity.

13. The lighting system controller according to claim 12, wherein the controller configured to request the indication of the synchronization method is further configured to present an indication of at least one of a send configuration method and a retrieve configuration method.

14. The lighting system controller according to claim 13, wherein the controller is further configured to:
receive, responsive to the request for the indication of the synchronization method, a request for the send configuration method; and
provide, responsive to the request for the send configuration method, the second configuration data to the lighting controller.

15. The lighting system controller according to claim 13, wherein the controller is further configured to:
receive, responsive to the request the indication of the synchronization method, a request for the retrieve configuration method; and
request, responsive to the request for the retrieve configuration method, the first configuration data from the lighting controller.

16. The lighting system controller according to claim 11, wherein the controller configured to synchronize is further configured to:
determine a first portion of the first configuration data to synchronize with a second portion of the second configuration data based on the comparison result; and
synchronize only the first portion and the second portion.

17. The lighting system controller according to claim 16, wherein the controller configured to determine the first portion is further configured to:
determine that the first portion and the second portion are associated with a category of configuration information;
determine that the first portion is associated with a first cyclic redundancy check of the first plurality of cyclic redundancy checks;
determine that the second portion is associated with a second cyclic redundancy check of the second plurality of cyclic redundancy checks; and
determine that the first cyclic redundancy check is not equal to the second cyclic redundancy check.

18. The lighting system controller according to claim 17, wherein the controller configured to determine that the first portion and the second portion are associated with a category of configuration information is further configured to read a map associating cyclic redundancy checks with categories of configuration information.

19. The lighting system controller according to claim 11, wherein the controller is further configured to synchronize the first plurality of cyclic redundancy checks with the second plurality of cyclic redundancy checks.

20. A lighting system controller comprising:
a network interface;
a memory; and
a means for synchronizing configuration information stored on the lighting system controller with configuration information stored on a lighting controller, the means including a synchronization method selected from a plurality of synchronization methods in response to a result of a comparison of a first plurality of cyclic redundancy checks to a second plurality of cyclic redundancy checks.

* * * * *